(12) United States Patent
Takahashi et al.

(10) Patent No.: US 11,789,085 B2
(45) Date of Patent: Oct. 17, 2023

(54) BATTERY DIAGNOSIS DEVICE, BATTERY DIAGNOSIS METHOD, NON-TRANSITORY STORAGE MEDIUM, AND VEHICLE

(71) Applicants: TOYOTA JIDOSHA KABUSHIKI KAISHA, Toyota (JP); DENSO TEN Limited, Kobe (JP)

(72) Inventors: Kohei Takahashi, Toyota (JP); Takayuki Akaishi, Toyota (JP); Sunao Horitake, Toyota (JP); Yuhki Shiozumi, Kobe (JP)

(73) Assignees: TOYOTA JIDOSHA KABUSHIKI KAISHA, Toyota (JP); DENSO TEN Limited, Kobe (JP)

( * ) Notice: Subject to any disclaimer, the term of this patent is extended or adjusted under 35 U.S.C. 154(b) by 80 days.

(21) Appl. No.: 17/217,443

(22) Filed: Mar. 30, 2021

(65) Prior Publication Data

US 2021/0311124 A1   Oct. 7, 2021

(30) Foreign Application Priority Data

Apr. 7, 2020   (JP) ................. 2020-069196

(51) Int. Cl.
*G01R 31/382*   (2019.01)
*H01M 10/42*   (2006.01)
(Continued)

(52) U.S. Cl.
CPC ......... *G01R 31/382* (2019.01); *G01R 31/367* (2019.01); *G01R 31/396* (2019.01); *H01M 10/4285* (2013.01); *H01M 10/48* (2013.01)

(58) Field of Classification Search
CPC .. G01R 31/382; G01R 31/396; G01R 31/367; H01M 10/4285; H01M 10/48
See application file for complete search history.

(56) References Cited

U.S. PATENT DOCUMENTS 6,006,146 A * 12/1999 Usui ................... G01M 17/007
340/439
6,094,031 A    7/2000 Shimane et al.
(Continued)

FOREIGN PATENT DOCUMENTS

JP    11-355904 A    12/1999
JP    2007-131076 A    5/2007
(Continued)

*Primary Examiner* — Raymond L Nimox
(74) *Attorney, Agent, or Firm* — Oblon, McClelland, Maier & Neustadt, L.L.P.

(57) ABSTRACT

A battery diagnosis device mounted on a vehicle includes a processor that acquires information about a battery and executes diagnosis of the state of the battery. The processor is configured to determine whether there is abnormality about a first item based on a result of a determination of whether a first state is matched, and the determination of whether the first state is matched is based on the information about the battery. The processor is configured to end the diagnosis of the battery, when the processor determines that there is no abnormality about the first item. The processor is configured to continue the diagnosis of the battery and determine whether there is abnormality about the first item, as a second determination, when the processor determines that there is abnormality about the first item.

11 Claims, 8 Drawing Sheets

(51) Int. Cl.
      *G01R 31/396*    (2019.01)
      *G01R 31/367*    (2019.01)
      *H01M 10/48*     (2006.01)

(56)            References Cited

U.S. PATENT DOCUMENTS

| | | | |
|---|---|---|---|
| 6,211,681 B1* | 4/2001 | Kagawa | B60L 50/61 |
| | | | 324/426 |
| 2001/0037168 A1* | 11/2001 | Hozuka | G07C 5/008 |
| | | | 340/439 |
| 2009/0281689 A1* | 11/2009 | Suganuma | G06F 11/006 |
| | | | 701/33.4 |
| 2009/0299561 A1* | 12/2009 | Matsumoto | B60K 6/28 |
| | | | 903/903 |
| 2013/0338867 A1* | 12/2013 | Sato | B60W 30/192 |
| | | | 903/903 |
| 2014/0333315 A1* | 11/2014 | Yamamoto | G01R 31/3835 |
| | | | 324/426 |
| 2015/0286272 A1* | 10/2015 | Kishigami | G06F 1/3212 |
| | | | 713/323 |
| 2020/0379050 A1 | 12/2020 | Imanaka et al. | |
| 2021/0114535 A1* | 4/2021 | Ye | G07C 5/006 |

FOREIGN PATENT DOCUMENTS

| | | | |
|---|---|---|---|
| JP | 2017-187146 A | 10/2017 | |
| JP | 2019-100878 A | 6/2019 | |

* cited by examiner

BATTERY DIAGNOSIS DEVICE, BATTERY DIAGNOSIS METHOD, NON-TRANSITORY STORAGE MEDIUM, AND VEHICLE

CROSS-REFERENCE TO RELATED APPLICATION

This application claims priority to Japanese Patent Application No. 2020-069196 filed on Apr. 7, 2020, incorporated herein by reference in its entirety.

BACKGROUND

1. Technical Field

The present disclosure relates to a battery diagnosis device, a battery diagnosis method, a non-transitory storage medium, and a vehicle, that diagnoses the state of a battery mounted on the vehicle.

2. Description of Related Art

In recent years, increase in functions of a vehicle and increase in added values of the vehicle have increased electric power that is consumed by in-vehicle apparatuses. Therefore, for a battery that is mounted on the vehicle as an electric power supply source of the in-vehicle apparatuses, it is necessary to appropriately manage the state of the battery, so as not to cause an influence on vehicle action and the like due to decrease in electricity storage rate (SOC: State Of Charge).

Japanese Patent Application Publication No. 2019-100878 discloses a technology of suitably managing the state of the battery by measuring an offset error of a current sensor necessary to estimate the electric storage rate (SOC) of the battery.

Japanese Patent Application Publication No. 11-355904 discloses a technology of providing a battery state detection unit for each battery constituting an assembled battery and suitably managing the state of the assembled battery based on the state detected by each battery state detection unit.

SUMMARY

When the vehicle is at a standstill, the charge of the battery is not performed, and therefore the electricity storage rate of the battery decreases due to electric power that is consumed for a process of diagnosing the state of the battery. Therefore, for reducing influence on start-up of the vehicle due to the decrease in the electricity storage rate of the battery as much as possible, there is room to further study the method for the battery diagnosis process when the vehicle is at a standstill.

The present disclosure provides a battery diagnosis device, a battery diagnosis method, a non-transitory storage medium and a vehicle, that make it possible to reduce the electric power that is consumed for the battery diagnosis process and to restrain the decrease in the electricity storage rate of the battery when the vehicle is at a standstill.

A battery diagnosis device according to a first aspect of the present disclosure is configured to diagnose the state of a battery mounted on a vehicle. The battery diagnosis device includes a processor configured to acquire information about the battery that includes at least one of voltage, current and temperature, and to execute diagnosis of the battery based on the acquired information about the battery. In the diagnosis of the battery, the processor is configured i) to determine, as a first determination, whether there is abnormality about a first item corresponding to a first state, based on a result of a determination of whether the state of the battery matches the first state, at a time point when a first time elapses from start of the diagnosis of the battery, when the vehicle is at a standstill. The determination of whether the state of the battery matches the first state is based on the information about the battery. In the diagnosis of the battery, the processor is configured ii) to end the diagnosis of the battery, when the processor determines in the first determination that there is no abnormality about the first item, and iii) to continue the diagnosis of the battery and determine, as a second determination, whether there is abnormality about the first item, after the time point when the first time elapses from the start of the diagnosis of the battery, when the processor determines in the first determination that there is abnormality about the first item.

With the battery diagnosis device according to the first aspect of the present disclosure, when the abnormality has not occurred in the battery, it is possible to simplify the battery diagnosis process when the vehicle is at a standstill, by performing only the first determination. A time necessary for the first determination is shorter than a time necessary for the second determination, and therefore a time during which the battery diagnosis device operates for the battery diagnosis is shorter, so that it is possible to reduce the electric power that is consumed for the battery diagnosis process and to restrain the decrease in the electricity storage rate of the battery when the vehicle is at a standstill.

In the battery diagnosis device according to the first aspect of the present disclosure, in the diagnosis of the battery, the processor may be configured i) to determine as the first determination, whether there is abnormality about the first item to an n-th item corresponding to the first state to an n-th state, based on a result of a determination of whether the state of the battery matches the first state to the n-th state, at the time point when the first time elapses from the start of the diagnosis of the battery, when the vehicle is at a standstill, the n being an integer of 2 or more, the determination of whether the state of the battery matches the first state to the n-th state being based on the information about the battery. In the diagnosis of the battery, the processor may be configured ii) to end the diagnosis of the battery, when the processor determines in the first determination that there is no abnormality about each of the first item to the n-th item. In the diagnosis of the battery, the processor may be configured iii) to continue the diagnosis of the battery, and determine, as the second determination, whether there is abnormality about one or more items of the first item to the n-th item, after the time point when the first time elapses from the start of the diagnosis of the battery, when the processor determines in the first determination that there is abnormality about the one or more items.

In the battery diagnosis device according to the first aspect of the present disclosure, the processor may be configured to continue the diagnosis of the battery about all of the first item to the n-th item, as the second determination, and determine whether there is abnormality about all of the first item to the n-th item, after the time point when the first time elapses from the start of the diagnosis of the battery, when the processor determines in the first determination that there is abnormality about the one or more items.

In the battery diagnosis device according to the first aspect of the present disclosure, the processor may be configured to continue the diagnosis of the battery about the one or more items and sub-items, as the second determination, states that correspond to the sub-items depending on states that correspond to the one or more items, and determine whether there is abnormality about the one or more items and the sub-items, after the time point when the first time elapses from the start of the diagnosis of the battery, when the processor determines in the first determination that there is abnormality about the one or more items.

In the battery diagnosis device according to the first aspect of the present disclosure, the processor may be configured to determine that there is abnormality about an item for which the processor determines in the first determination that there is abnormality, as the second determination, when an abnormal state of the item for which the processor determines in the first determination that there is abnormality has consecutively continued for a second time from a time point after the start of the diagnosis of the battery and before the first time elapses.

In the battery diagnosis device according to the first aspect of the present disclosure, the second time may be set for each item.

In the battery diagnosis device according to the first aspect of the present disclosure, the processor may be configured to execute the first determination with a certain period, and to determine that there is abnormality about an item for which the processor determines in the first determination that there is abnormality a certain number of times in a row, as the second determination.

In the battery diagnosis device according to the first aspect of the present disclosure, in the diagnosis of the battery, the processor may be configured iv) to determine, as a third determination, whether there is abnormality about the item, for a longer time than the first time, from the start of the diagnosis of the battery, with a certain period, when the vehicle is not at a standstill.

In a battery diagnosis method according to a second aspect of the present disclosure, the state of a battery mounted on a vehicle is diagnosed. The battery diagnosis method includes: acquiring information about the battery that includes at least one of voltage, current and temperature; and executing diagnosis of the battery based on the acquired information about the battery. The diagnosis of the battery includes i) determining, as a first determination, whether there is abnormality about a first item corresponding to a first state, based on a result of a determination of whether the state of the battery matches the first state, at a time point when a first time elapses from start of the diagnosis of the battery, when the vehicle is at a standstill, the determination of whether the state of the battery matches the first state being based on the information about the battery, ii) ending the diagnosis of the battery, when the processor determines in the first determination that there is no abnormality about the first item, and iii) continuing the diagnosis of the battery and determining, as a second determination, whether there is abnormality about the first item, after the time point when the first time elapses from the start of the diagnosis of the battery, when the processor determines in the first determination that there is abnormality about the first item.

A non-transitory storage medium according to a third aspect of the present disclosure stores instructions that are executable by one or more processors and that cause the one or more processors to perform functions to diagnose a state of a battery mounted on a vehicle. The functions includes: acquiring information about the battery that includes at least one of voltage, current and temperature; and executing diagnosis of the battery based on the acquired information about the battery. The diagnosis of the battery includes i) determining, as a first determination, whether there is abnormality about a first item corresponding to a first state, based on a result of a determination of whether the state of the battery matches the first state, at a time point when a first time elapses from start of the diagnosis of the battery, when the vehicle is at a standstill, the determination of whether the state of the battery matches the first state being based on the information about the battery, ii) ending the diagnosis of the battery, when it is determined in the first determination that there is no abnormality about the first item, and iii) continuing the diagnosis of the battery and determining, as a second determination, whether there is abnormality about the first item, after the time point when the first time elapses from the start of the diagnosis of the battery, when it is determined in the first determination that there is abnormality about the first item.

The battery diagnosis device according to the first aspect of the present disclosure may be mounted on a vehicle.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Embodiment

In the case where a battery diagnosis process is performed when a vehicle is at a standstill, a battery diagnosis device in the present disclosure executes a tentative diagnosis that requires a shorter time than a time necessary for a main diagnosis. If the tentative diagnosis shows that there is no abnormality, the battery diagnosis process is ended without the main diagnosis. If the tentative diagnosis shows that there is abnormality, the battery diagnosis process is continued, and the main diagnosis is executed. An embodiment of the present disclosure will be described below in detail with reference to the drawings.

Configuration

Figure 1:
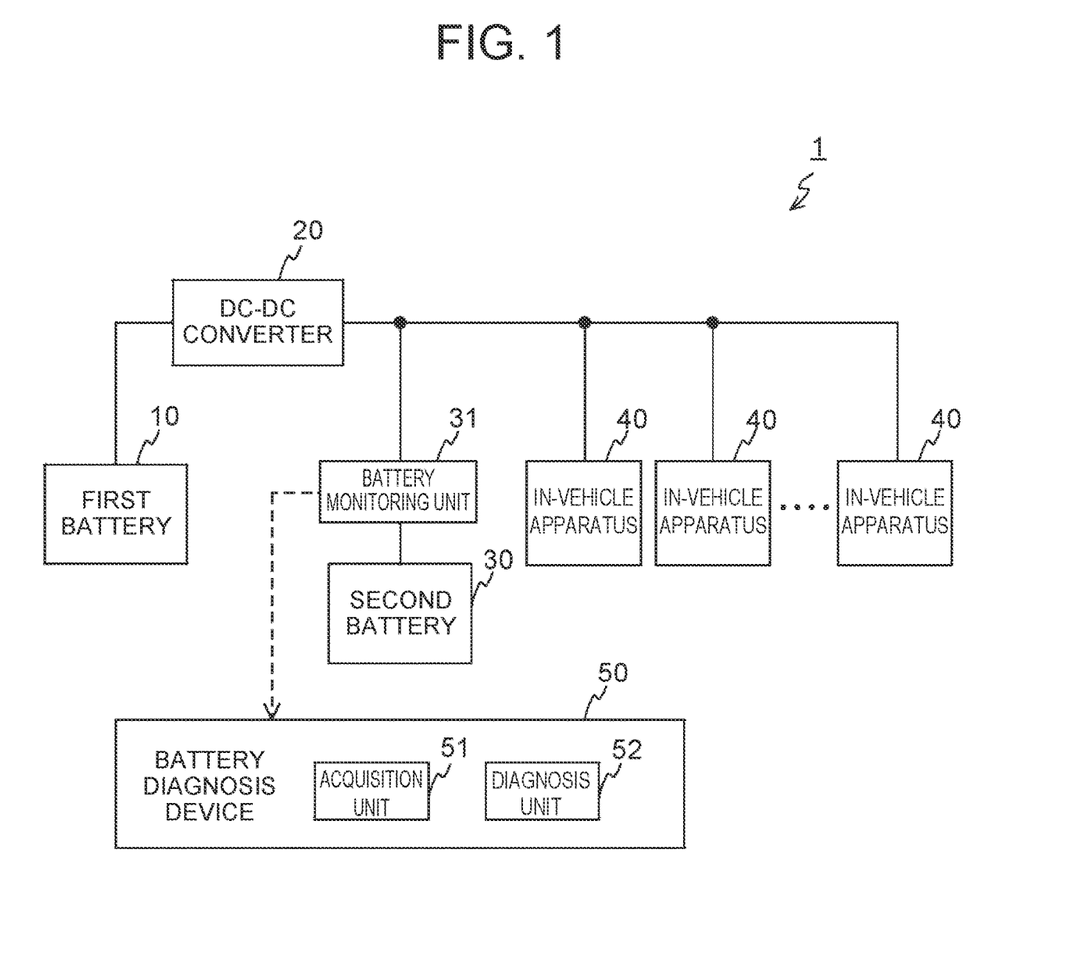
FIG. 1 is a schematic block diagram of an electric power supply system that includes a battery diagnosis device according to an embodiment.

FIG. 1 is a block diagram showing a schematic configuration of an electric power supply system that includes a battery diagnosis device according to an embodiment of the present disclosure. An electric power supply system 1 illustrated in FIG. 1 includes a first battery 10, a DC-DC converter 20, a second battery 30, a battery monitoring unit 31, a plurality of in-vehicle apparatuses 40, and a battery diagnosis device 50 according to the embodiment. The electric power supply system 1 is mounted on a vehicle such as an automobile that uses an internal combustion engine as a dynamic power source, and a hybrid vehicle (HV) that uses an electric motor as a dynamic power source.

The first battery 10 is a battery that supplies electric power to an unillustrated electric motor, the DC-DC converter 20 and the like. As the first battery 10, a secondary battery configured such that charge and discharge can be performed, as exemplified by a lithium-ion battery, is used.

The DC-DC converter 20 is connected to the first battery 10, the second battery 30 and the plurality of in-vehicle apparatuses 40. The electric power of the first battery 10 is supplied to the second battery 30 and the plurality of in-vehicle apparatuses 40. At the time of the supply of the electric power, the DC-DC converter 20 can convert the voltage of the first battery 10, which is an input voltage, into a predetermined voltage, and can output the predetermined voltage.

The second battery 30 is a battery that is charged by the electric power output from the DC-DC converter 20 and that discharges the electric power of the second battery 30. As the second battery 30, for example, a secondary battery such as a lithium-ion battery is used.

The battery monitoring unit 31 monitors the state of the second battery 30. Specifically, the battery monitoring unit 31 detects the voltage, current and temperature of the second battery 30, using a voltage sensor, a current sensor and a temperature sensor, which are not illustrated. The battery monitoring unit 31 transfers the detected information (including at least one of the voltage, the current and the temperature) about the second battery 30, to the battery diagnosis device 50.

The in-vehicle apparatuses 40 are various devices (auxiliary machines) mounted on the vehicle, and operates using the electric power output from the DC-DC converter 20 or the electric power of the second battery 30. Examples of the in-vehicle apparatuses 40 include actuators such as a motor and a solenoid, lights such as a head lamp and a room light, air conditioners such as a heater and a cooler, and electronic control units (ECUs) for steering assist, brake assist, automatic driving and advanced driving assist.

The battery diagnosis device 50 determines whether there is abnormality about various states relevant to the second battery 30, based on the information, that is transferred from the battery monitoring unit 31, about the second battery 30, and other information. The battery diagnosis device 50 can switch an operation mode between a "wake-up mode" in which all functions operate and a "sleep mode" in which some functions stop for reducing electric power consumption compared to the wake-up mode.

Typically, the battery diagnosis device 50 can be configured as an ECU that includes a processor, a memory and an input-output interface. In the battery diagnosis device 50 according to the embodiment, the processor reads and executes programs stored in the memory, so that functions of an acquisition unit 51 and a diagnosis unit 52, which are described below, are realized.

The acquisition unit 51 acquires the information about the second battery 30 from the battery monitoring unit 31. Based on the information about the second battery 30 that is acquired by the acquisition unit 51, the diagnosis unit 52 executes a battery diagnosis control to diagnose the state of the second battery 30, as follows.

In the above configuration example, the first battery 10 is a battery that supplies electric power to the electric motor and the like, namely, a so-called driving battery, and the second battery 30 is a battery that supplies electric power to the in-vehicle apparatuses 40, namely, a so-called auxiliary machine battery. However, instead of this configuration, for example, the first battery 10 may be used as a main-battery that supplies electric power to apparatuses for automatic driving, and the second battery 30 may be used as a sub-battery that backs up the main-battery.

Control

Controls that are performed by the battery diagnosis device 50 according to the embodiment will be described with reference to FIG. 2 to FIG. 7.

(1) Control when Vehicle is at Standstill

Figure 2:
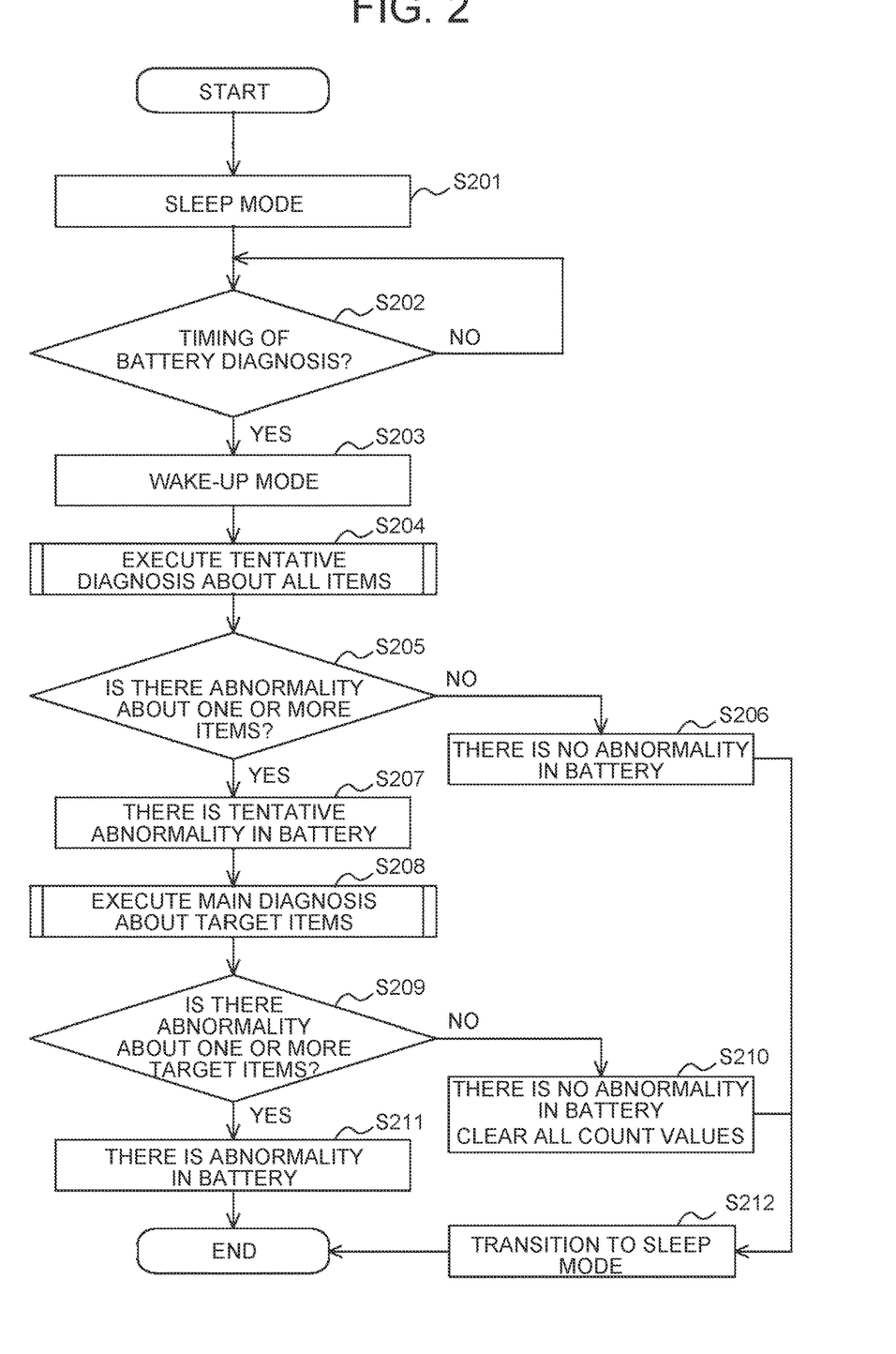
FIG. 2 is a flowchart of a control that is executed by the battery diagnosis device when a vehicle is at a standstill.
Figure 3:
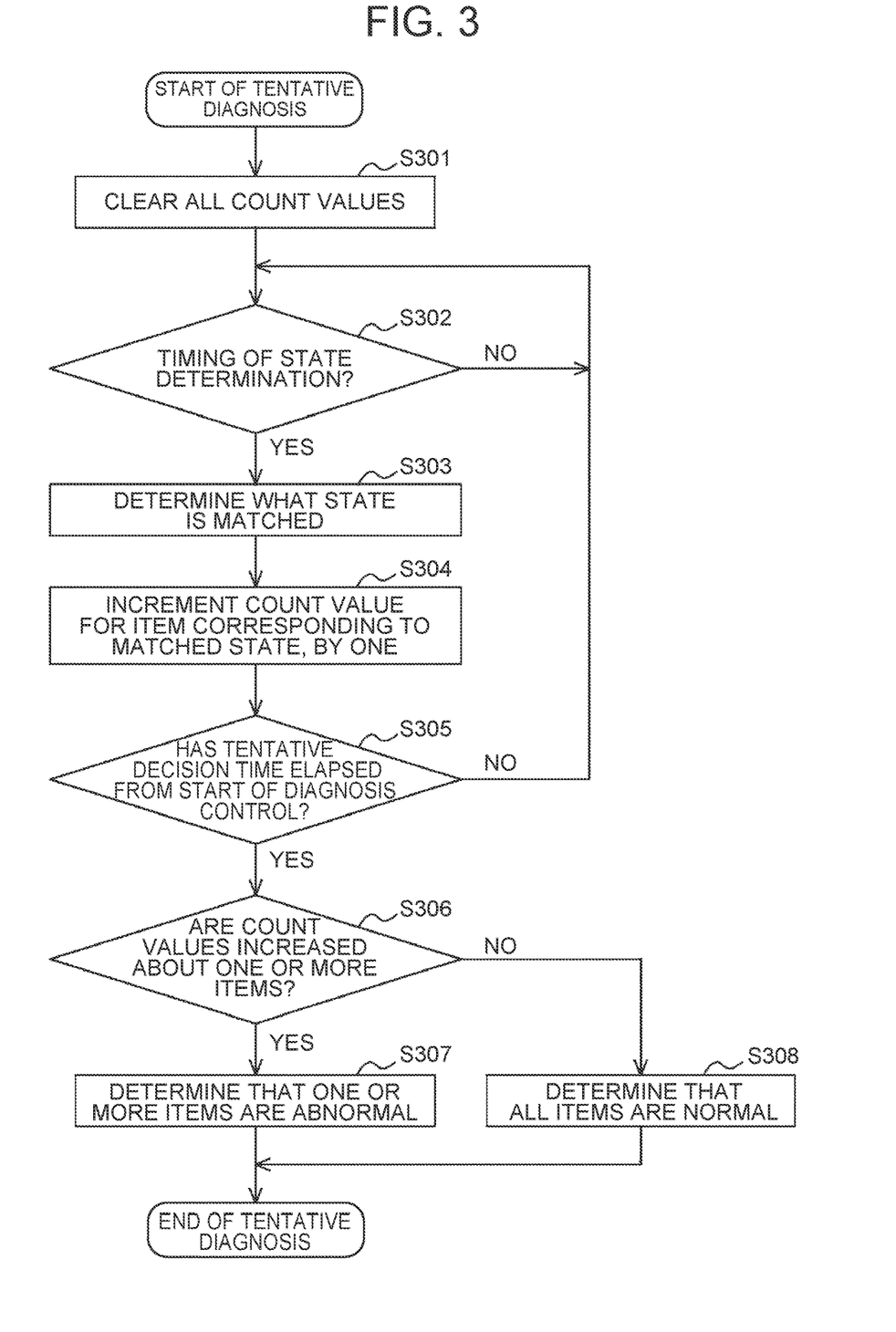
FIG. 3 is a flowchart showing a detailed processing procedure of a tentative diagnosis.
Figure 4:
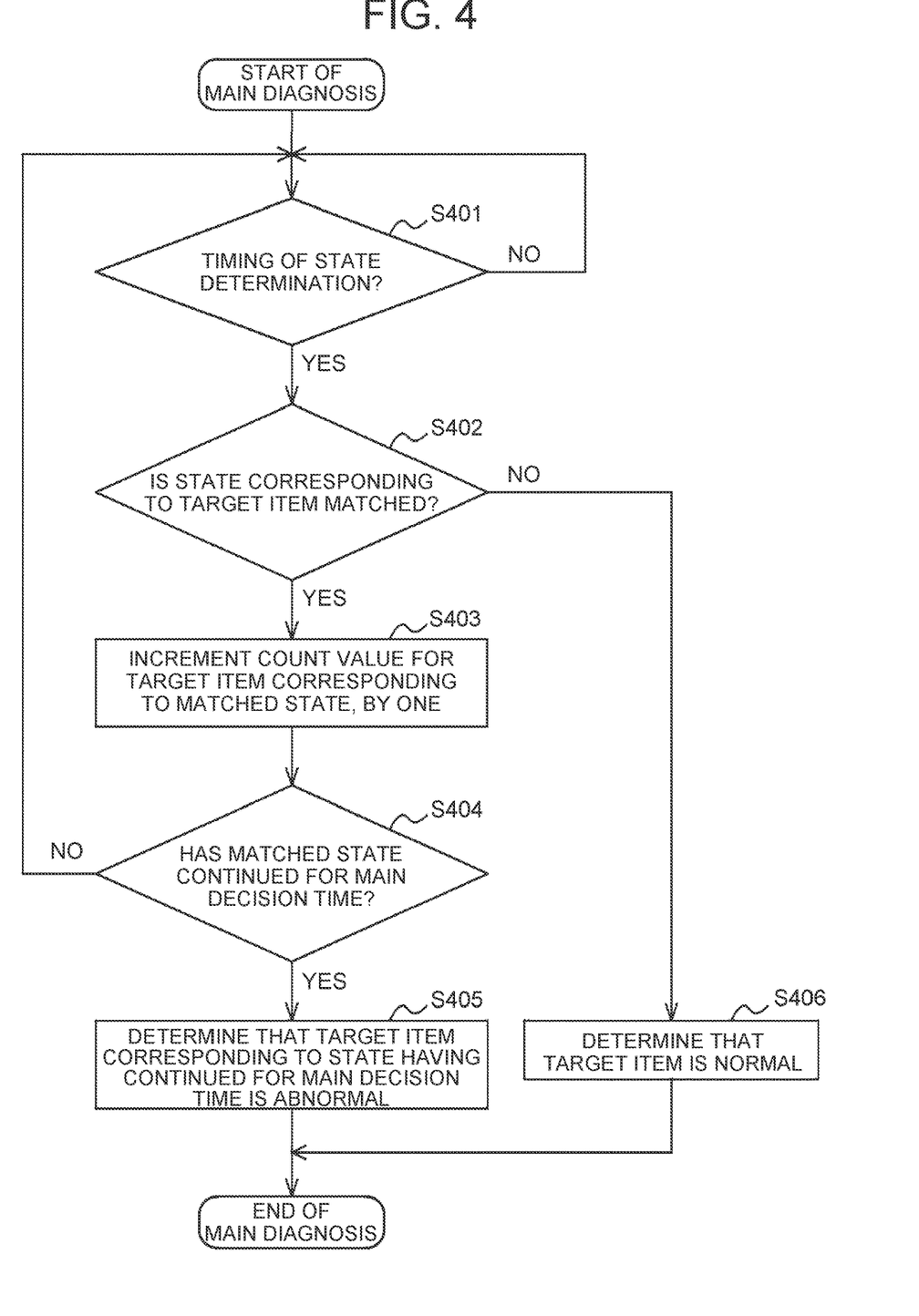
FIG. 4 is a flowchart showing a detailed processing procedure of a main diagnosis.

FIG. 2 is a flowchart showing a processing procedure of a battery diagnosis control that is executed by the battery diagnosis device 50 when the vehicle is at a standstill. FIG. 3 is a detailed flowchart of a tentative diagnosis that is executed in step S204 of FIG. 2. FIG. 4 is a detailed flowchart of a main diagnosis that is executed in step S208 of FIG. 2.

The battery diagnosis control shown in FIG. 2 is started when the vehicle becomes a standstill state. Whether the vehicle is in the standstill state can be determined, for example, based on whether an ignition switch is in an off-state. The battery diagnosis control in FIG. 2 is repeatedly executed while the ignition switch is in the off-state.

Step S201: The battery diagnosis device 50 sets the operation mode of the battery diagnosis device 50 to the sleep mode. In the case where the operation mode just before the battery diagnosis control is started is the wake-up mode, the operation mode transitions from the wake-up mode to the sleep mode. In the case where the operation mode just before the battery diagnosis control is started is the sleep mode, the sleep mode is maintained as the operation mode. Thereby, some functions of the battery diagnosis device 50 are stopped, so that electric power consumption is reduced. After the operation mode is set to the sleep mode, the process proceeds to step S202.

Step S202: The battery diagnosis device 50 determines whether the current timing is a timing when the battery diagnosis device 50 diagnoses the second battery 30. This timing, for example, may be a timing when a certain time elapses from the last diagnosis, and typically, may be a timing when a certain time elapses after the operation mode is set to the sleep mode in step S201. The certain time may be statically set in advance, or may be dynamically set depending on a vehicle use tendency of a user (length of a parking time, usage situation of the in-vehicle apparatuses, and the like). In the case of the timing when the battery diagnosis device 50 diagnoses the second battery 30 (YES in step S202), the process proceeds to step S203.

Step S203: The battery diagnosis device 50 sets the operation mode of the battery diagnosis device 50 to the wake-up mode. That is, the operation mode of the battery diagnosis device 50 transitions from the sleep mode to the wake-up mode. Thereby, all functions of the battery diagnosis device 50 operate. After the operation mode is set to the wake-up mode, the process proceeds to step S204.

Step S204: The battery diagnosis device 50 executes the tentative diagnosis about all of a first item to an n-th item relevant to the second battery 30. Here, the tentative diagnosis that is executed in step S204 will be described with reference to FIG. 3.

Step S301: The battery diagnosis device 50 clears and initializes all count values of a first counter to an n-th counter that are respectively provided for the first item to the n-th item relevant to the second battery 30. Thereafter, the process proceeds to step S302.

Step S302: The battery diagnosis device 50 determines whether the current timing is a timing when the battery diagnosis device 50 determines various states relevant to the second battery 30. This timing is typically set at regular intervals from the start of the battery diagnosis control, and for example, can be set based on the period (for example, 100 milliseconds) of an operation clock that is used in the battery diagnosis device 50. As the various states, that are determination targets, relevant to the second battery 30, at least a first state is set in advance, and preferably, a plurality of states of the first state to an n-th state should be set in advance. Examples of the first state to the n-th state include a state where a disconnection in the sensors monitoring the second battery 30 is suspected, a state where a short circuit in an electric power supply for supplying electric power to constituents that control the second battery 30 is suspected, a state where the output (voltage or current) of the second battery 30 exceeds an upper limit, a state where the output (voltage or current) of the second battery 30 falls below a lower limit, and a state where a charge-discharge pattern of the second battery 30 is significantly different from a prescribed pattern. In the case of the timing when the battery diagnosis device 50 determines the various states relevant to the second battery 30 (YES in step S302), the process proceeds to step S303.

Step S303: the battery diagnosis device 50 determines what state is matched among the first state to the n-th state relevant to the second battery 30. As the determination method, for example, the battery diagnosis device 50 acquires the voltage value of the voltage sensor as the information about the second battery 30, and in the case where the voltage value of the voltage sensor indicates a voltage value outside a control range, the battery diagnosis device 50 determines that the state where a disconnection in the voltage sensor is suspected is matched. Alternatively, the battery diagnosis device 50 acquires the current value of the current sensor as the information about the second battery 30, and in the case where the current value of the current sensor indicates a current value outside a control range, the battery diagnosis device 50 determines that the state where a disconnection in the current sensor is suspected is matched. Alternatively, the battery diagnosis device 50 acquires the temperature value of the temperature sensor as the information about the second battery 30, and in the case where the temperature value of the temperature sensor indicates a temperature value outside a control range, the battery diagnosis device 50 determines that the state where a disconnection in the temperature sensor is suspected is matched. After the determination of the state relevant to the second battery 30 ends, the process proceeds to step S304.

Step S304: The battery diagnosis device 50 increments, by one, the count value of a counter for a single or a plurality of items corresponding to a single or a plurality of states for which it is determined to be matched. For example, in the case where the battery diagnosis device 50 determines that the first state is matched, the battery diagnosis device 50 increments the count value for the first item corresponding to the first state, by one. Further, in the case where the battery diagnosis device 50 determines that the second state is matched, the battery diagnosis device 50 increments the count value for the second item corresponding to the second state, by one. States and items do not need to have a one-to-one correspondence. A plurality of items may correspond to a single state, and a single item may correspond to a plurality of states. Thereafter, the process proceeds to step S305.

Step S305: The battery diagnosis device 50 determines whether a first time has elapsed from the start of the tentative diagnosis of the second battery 30. The first time is a time (referred to as a "tentative decision time" hereinafter) in which the result of the determination by the tentative diagnosis is decided, and is set to a shorter time than a later-described time in which the result of the determination by the main diagnosis is decided, in order to reduce the electric power consumption of the second battery 30. For example, in the case where the main decision time is 4000 milliseconds, the tentative decision time can be set to 1000 milliseconds. In the case where the tentative decision time has not elapsed from the start of the tentative diagnosis of the second battery 30 (NO in step S305), the process proceeds to step S302. On the other hand, in the case where the tentative decision time has elapsed from the start of the tentative diagnosis of the second battery 30 (YES in step S305), the process proceeds to step S306.

In the tentative diagnosis, the count value for an item corresponding to a state for which it is not determined to be matched at each state determination timing from the start of the tentative diagnosis to the elapse of the tentative decision time is "0", and the count value for an item corresponding to a state for which it is determined to be matched at one or more state determination timings is "1 or more". For example, in the case where the above processes in step S302, step S303 and step S304 are repeated with a period of 100 milliseconds from the start of the tentative diagnosis and end at a time point of 1000 milliseconds (tentative decision time), each count value for the first item to the n-th item is one value of 0 to 10 depending on the number of timings of occurrence of the first state to the n-th state.

Step S306: The battery diagnosis device 50 determines whether the count value has been increased about one or more items among the first item to the n-th item as a result of the determination by the tentative diagnosis, that is, whether there is an item for which the count value is one or more. In the case where the count value has been increased about one or more items (YES in step S306), the process proceeds to step S307. On the other hand, in the case where the count value has not been increased about any item (NO in step S306), the process proceeds to step S308.

Step S307: The battery diagnosis device 50 determines that there is abnormality in the second battery 30 about the one or more items for which the count value has been increased. Then, the tentative diagnosis ends.

Step S308: The battery diagnosis device 50 determines that all of the first item to the n-th item are normal in the second battery 30 with no abnormality. Then, the tentative diagnosis ends.

In the tentative diagnosis, when once it is determined that at least one state is matched at one state determination timing from the start of the tentative diagnosis to the elapse of the tentative decision time, the battery diagnosis device 50 determines that there is abnormality about the item corresponding to the state of the second battery 30 for which it is determined to be matched.

Back to FIG. 2, the description of the battery diagnosis control will be resumed.

Step S205: The battery diagnosis device 50 determines whether it is determined that there is abnormality about one or more items of the first item to the n-th item as a result of the tentative diagnosis. In the case where it is determined that there is abnormality about one or more items (YES in step S205), the process proceeds to step S207. On the other hand, in the case where it is determined that there is no abnormality about any item (NO in step S205), the process proceeds to step S206.

Step S206: The battery diagnosis device 50 determines that there is no abnormality in the second battery 30 (first determination). Thereafter, the process proceeds to step S212.

Figure 5:
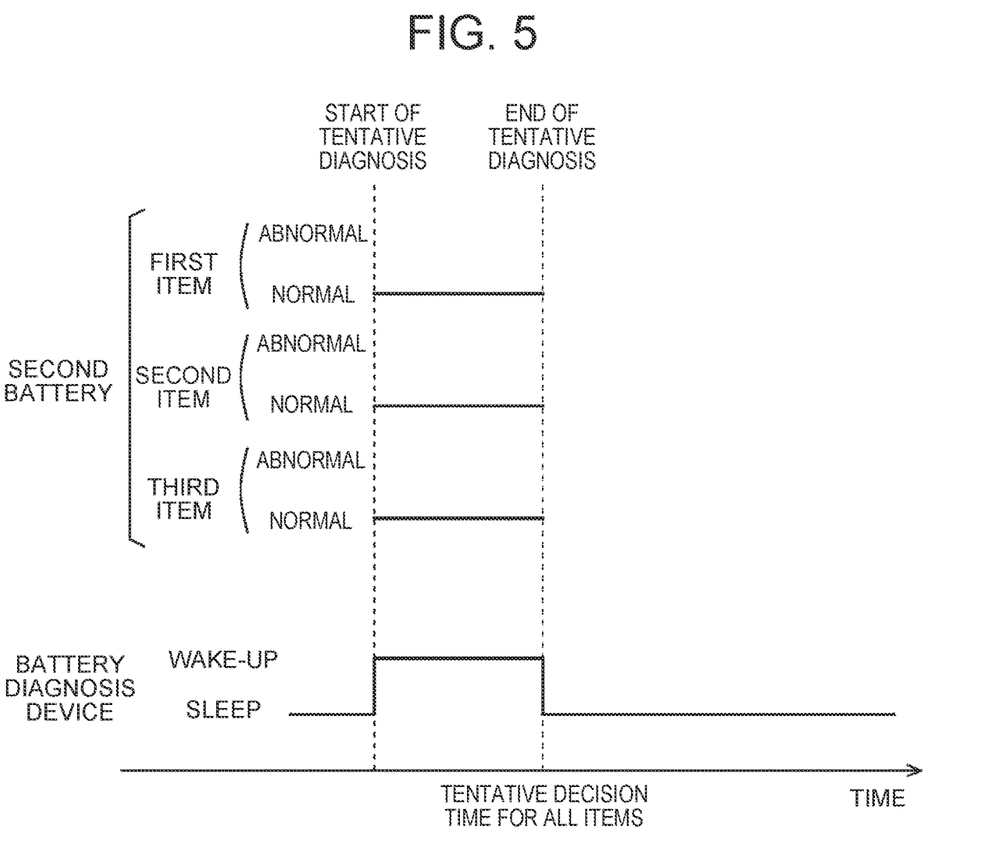
FIG. 5 is an exemplary timing chart in the case where it is determined in the tentative diagnosis that there is no abnormality.

FIG. 5 is an exemplary timing chart showing states for which it is determined that there is no abnormality in the second battery 30 in the tentative diagnosis. In the example of FIG. 5, each of the first item, the second item and the third item relevant to the second battery 30 is never abnormal, and is normal, from the start of the tentative diagnosis to the elapse of the tentative decision time. Therefore, the battery diagnosis device 50 determines that there is no abnormality in the second battery 30, and the tentative diagnosis ends.

Step S207: The battery diagnosis device 50 determines that there can be abnormality in the second battery 30 (first determination), and decides to switch the diagnosis control of the second battery 30 from the tentative diagnosis to the main diagnosis and to continue the diagnosis control of the second battery 30.

Step S208: The battery diagnosis device 50 executes the main diagnosis about items (referred to as "target items" hereinafter) that are targets of the main diagnosis among the first item to the n-th item relevant to the second battery 30. Typically, the target items can be items for which the count value has been increased in the tentative diagnosis of step S204. Further, the target items may include sub-items, in addition to main-items for which the count value has been increased in the tentative diagnosis of step S204. The sub-item is an item for which a state corresponding to the sub-item depends on a state corresponding to the main-item. For example, in the case where the disconnection in the voltage sensor is suspected, the detected voltage value is not reliable, and therefore, the determination of the detected voltage should be suspended until it is decided whether the disconnection in the voltage sensor has occurred. Consequently, in this case, the main-item may be the voltage sensor, and the sub-item may be the output voltage of the second battery 30. An exemplary state where it is determined that the voltage sensor as the main-item is abnormal is a state where the disconnection in the voltage sensor is suspected. The target items may be all of the first item to the n-th item. Here, the main diagnosis that is executed in step S208 will be described with reference to FIG. 4.

Step S401: The battery diagnosis device 50 determines whether the current timing is a timing when the battery diagnosis device 50 determines various states relevant to the second battery 30. This timing, which is the same as the timing in step S302, is typically set at regular intervals from the start of the battery diagnosis control, and for example, can be set based on the period (for example, 100 milliseconds) of the operation clock that is used in the battery diagnosis device 50. In the case of the timing when the battery diagnosis device 50 determines the various states relevant to the second battery 30 (YES in step S401), the process proceeds to step S402.

Step S402: The battery diagnosis device 50 determines whether a state corresponding to the target item is matched. In the case of a plurality of target items, the battery diagnosis device 50 determines whether a corresponding state is matched for each target item. In the case where the battery diagnosis device 50 determines that at least one state corresponding to the target item is matched (YES in step S402), the process proceeds to step S403. On the other hand, in the case where the battery diagnosis device 50 determines that no state corresponding to the target item is matched (NO in step S402), the process proceeds to step S406.

Step S403: The battery diagnosis device 50 increments, by one, the count value of a counter for a single or a plurality of target items corresponding to a single or a plurality of states for which it is determined to be matched. The count value in the main diagnosis is added to the count value in the tentative diagnosis. Thereafter, the process proceeds to step S404.

Step S404: The battery diagnosis device 50 determines whether the single or the plurality of states for which it is determined to be matched has consecutively continued for a second time from a time point after the start of the battery diagnosis control and before the tentative decision time (first time) elapses. The second time is a time (referred to as a "main decision time" hereinafter) in which the result of the determination by the main diagnosis is decided. As the main decision time, an identical time may be uniformly set for all target items, or a different time may be set for each target item. The continuation of the main decision time can be determined based on the count value of the counter, but may be determined based on the length of the actual time. In the case where the single or the plurality of states for which it is determined to be matched has continued for the main decision time (YES in step S404), the process proceeds to step S405. On the other hand, in the case where the single or the plurality of states for which it is determined to be matched has not continued for the main decision time (NO in step S404), the process proceeds to step S401.

Step S405: The battery diagnosis device 50 determines that there is abnormality in the second battery 30 about the target item corresponding to the state having continued for the main decision time. Then, the main diagnosis ends.

Step S406: The battery diagnosis device 50 determines that all target items are normal in the second battery 30 with no abnormality. Then, the main diagnosis ends.

In the main diagnosis, the diagnosis target is narrowed down to the item corresponding to the state for which it is determined to be matched at the stage of the tentative diagnosis, and in the case where the state has continued for the main decision time (second time) from the tentative diagnosis to the main diagnosis, it is determined that the item (target item) corresponding to the state is abnormal.

Back to FIG. 2, the description of the battery diagnosis control will be resumed.

Step S209: The battery diagnosis device 50 determines whether it is determined that there is abnormality about one or more target items among the target items as a result of the main diagnosis. In the case where it is determined that there is abnormality about one or more target items (YES in step S209), the process proceeds to step S211. On the other hand, in the case where it is determined there is no abnormality about any target item (NO in step S209), the process proceeds to step S210.

Step S210: The battery diagnosis device 50 determines that there is no abnormality in the second battery 30 (second determination). Further, the battery diagnosis device 50 clears and initializes all count values of the first counter to the n-th counter that are respectively provided for the first item to the n-th item relevant to the second battery 30. Thereafter, the process proceeds to step S212.

Figure 6:
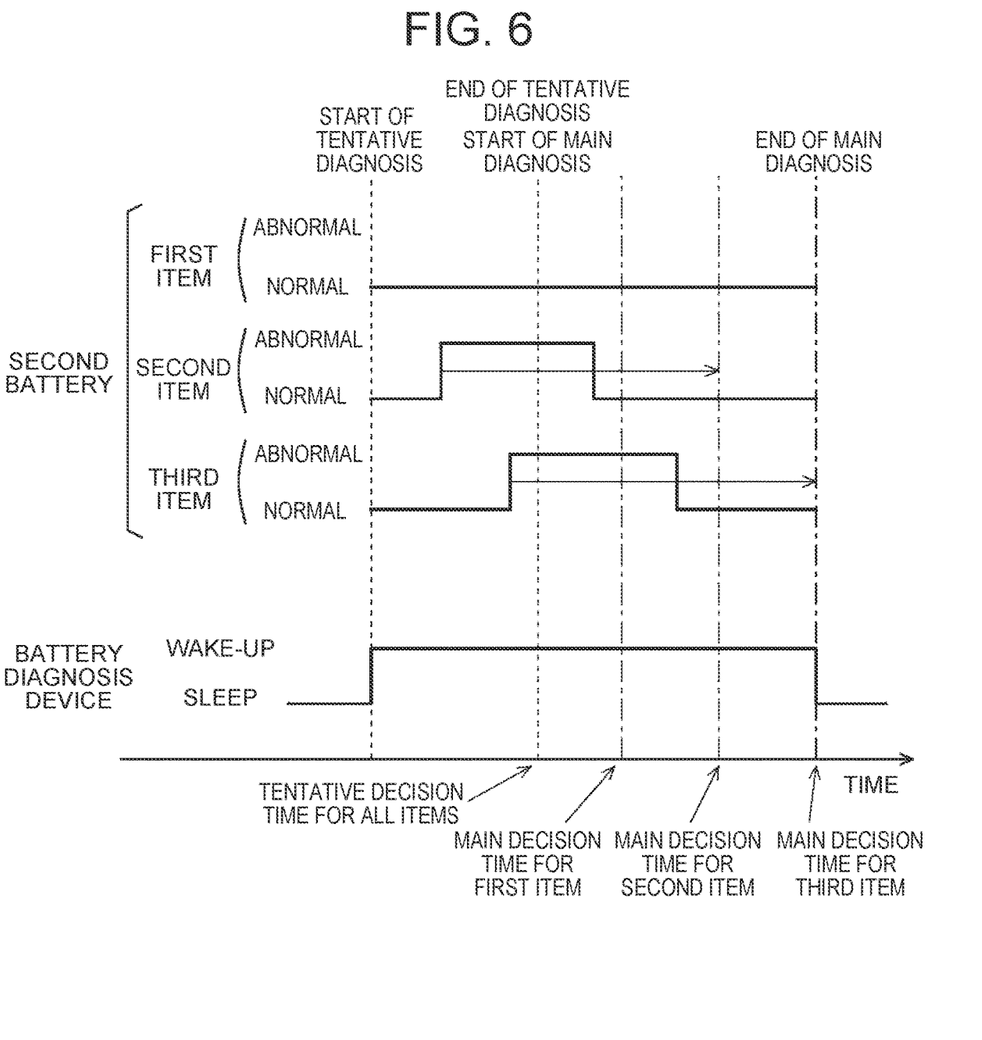
FIG. 6 is an exemplary timing chart in the case where it is determined in the tentative diagnosis that there is abnormality and it is determined in the main diagnosis that there is no abnormality.

FIG. 6 is an exemplary timing chart showing states of items for which it is determined in the tentative diagnosis that there is abnormality in the second battery 30 and it is determined in the main diagnosis that there is no abnormality in the second battery 30. In the example of FIG. 6, in a time period after the tentative diagnosis starts and before the tentative decision time elapses, abnormality is shown about the second item and the third item relevant to the second battery 30, and therefore the diagnosis control is switched to the main diagnosis. In the main diagnosis, both the second item and the third item return to normality before the main decision time elapses. Therefore, the battery diagnosis device 50 determines that there is no abnormality in the second battery 30, and the main diagnosis ends.

Step S211: The battery diagnosis device 50 determines that there is abnormality in the second battery 30 (second determination), and ends the battery diagnosis control. In the case of this determination, as necessary, the battery diagnosis device 50 may execute a self-diagnosis of the electric power supply system 1 to record an abnormality log, may perform a measure such as separation of the second battery 30 from the electric power supply system 1, or may notify an occupant of the vehicle that there is abnormality in the second battery 30, through a display, a voice or the like. Further, in the case of this determination, if the abnormality in the second battery 30 is an abnormality that allows the battery diagnosis device 50 to be set to the sleep mode, the operation mode of the battery diagnosis device 50 may transition from the wake-up mode to the sleep mode.

Step S212: The battery diagnosis device 50 sets the operation mode of the battery diagnosis device 50 to the sleep mode. That is, the operation mode of the battery diagnosis device 50 transitions from the wake-up mode to the sleep mode. Thereafter, the battery diagnosis device 50 ends the battery diagnosis control. As described above, the battery diagnosis device 50 periodically repeats the battery diagnosis control while the ignition switch is in the off-state.

Figure 7:
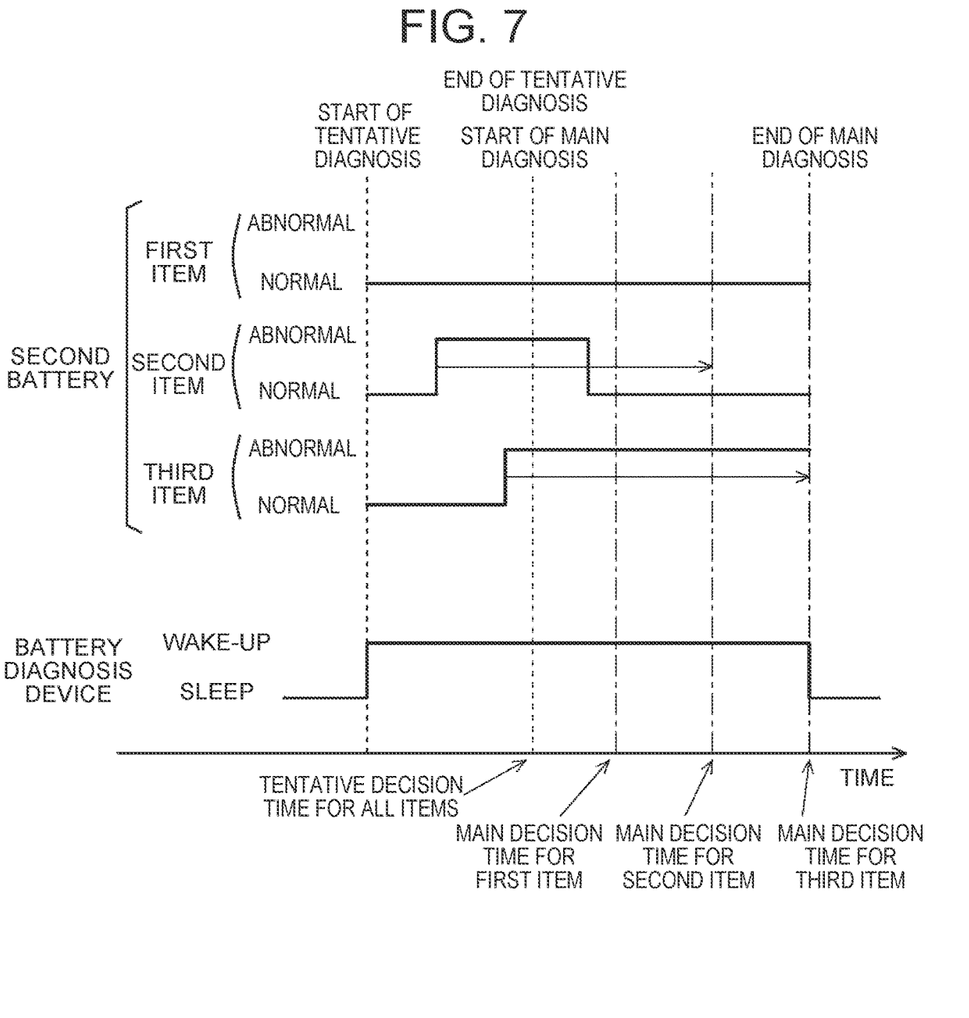
FIG. 7 is an exemplary timing chart in the case where it is determined in the tentative diagnosis that there is abnormality and it is determined in the main diagnosis that there is abnormality.

FIG. 7 is an exemplary timing chart showing states of items for which it is determined in the tentative diagnosis that there is abnormality in the second battery 30 and it is determined in the main diagnosis that there is abnormality in the second battery 30. In the example of FIG. 7, in the time period after the tentative diagnosis starts and before the tentative decision time elapses, abnormality is shown about the second item and the third item relevant to the second battery 30, and therefore the diagnosis control is switched to the main diagnosis. In the main diagnosis, the second item returns to normality before the main decision time elapses. On the other hand, the third item is consecutively abnormal for the main decision time. Therefore, the battery diagnosis device 50 determines that there is abnormality in the second battery 30, and the main diagnosis ends.

In the above embodiment, the case where the main diagnosis ends on the basis of the longest main decision time has been described. That is, in the examples shown in FIG. 6 and FIG. 7, the main diagnosis ends on the basis of the main decision time for the third item. However, in the case where it is determined in the main diagnosis that there is no abnormality in the second battery 30, the main diagnosis may end as soon as abnormality is eliminated about all items. For example, in FIG. 6, without waiting for the elapse of the main decision time for the third item, the main diagnosis ends at the time point when the third item becomes normal. Thereby, the battery diagnosis device 50 can transition to the sleep mode early, so that electric power consumption is reduced.

There can be a case where an item showing abnormality in the main diagnosis temporarily returns to normality due to influence of noise or the like and then shows abnormality again. As a countermeasure against such a case, the main diagnosis may end after waiting for the elapse of the main decision time for the item even when the item returns to normality, or the main diagnosis may end after a predetermined time-out elapses from the time point when the item returns to normality. The time-out can be set to a shorter time than the remaining time of the main decision time.

The tentative diagnosis in the embodiment is repeatedly executed with a certain period (at every timing when the battery diagnosis device 50 diagnoses the second battery 30). The battery diagnosis device 50 may cumulatively record the result of the tentative diagnosis that is executed at each timing, and in the main diagnosis, may immediately determine that there is abnormality about an item for which the battery diagnosis device 50 determines in the tentative diagnosis that there is abnormality a certain number of times in a row. By further performing such a determination in the tentative diagnosis in addition to the determination in the main diagnosis, it is possible to improve the accuracy of the abnormality diagnosis.

(2) Control when Vehicle is not at Standstill

Figure 8:
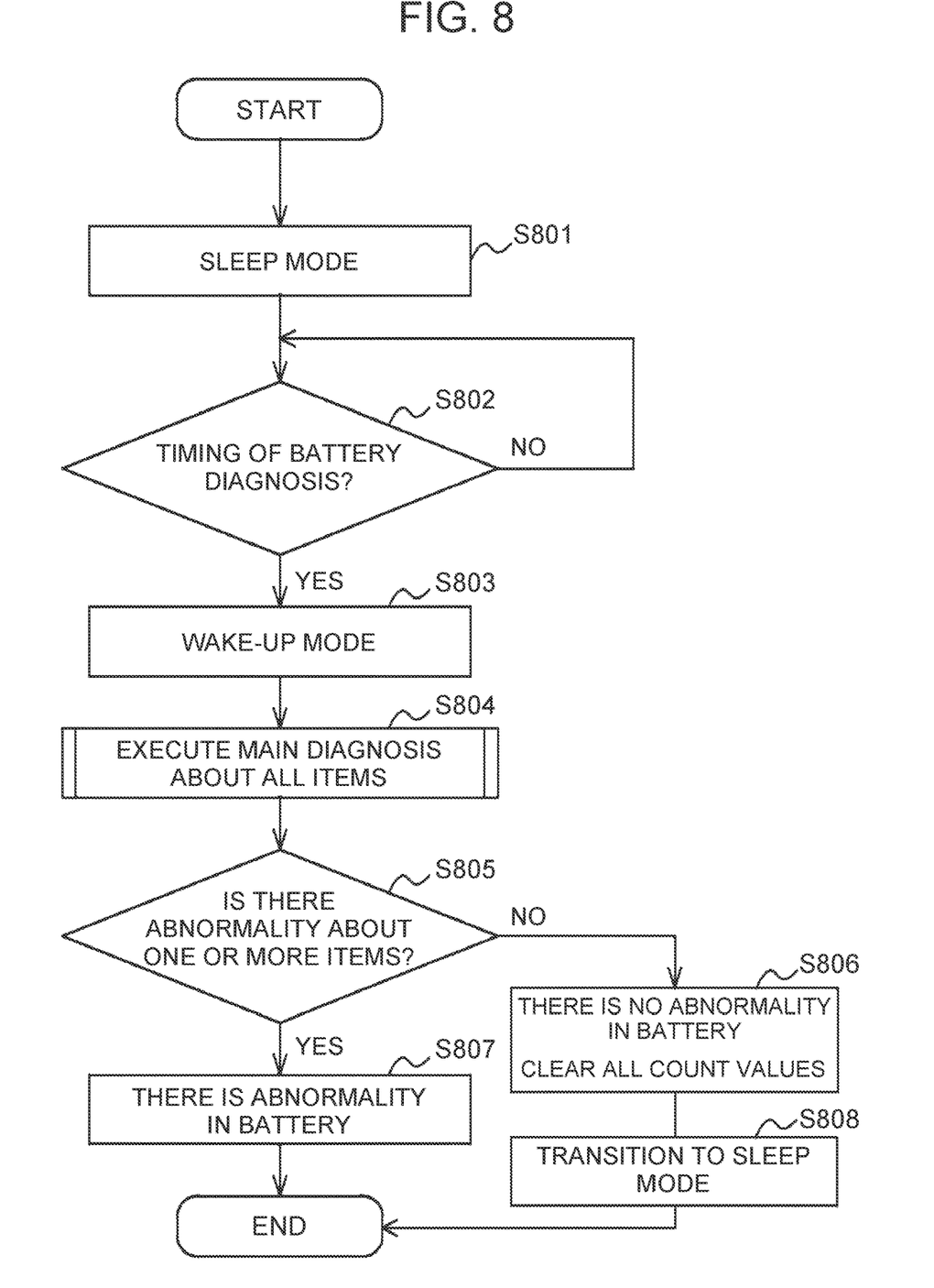
FIG. 8 is a flowchart of a control that is executed by the battery diagnosis device when a vehicle is not at a standstill.

FIG. 8 is a flowchart showing a processing procedure of a battery diagnosis control that is executed by the battery diagnosis device 50 when the vehicle is not at a standstill.

The battery diagnosis control shown in FIG. 8 is started when the vehicle becomes a non-standstill state. Whether the vehicle is in the standstill state can be determined, for example, based on whether the ignition switch is in the off-state. The battery diagnosis control in FIG. 8 is repeatedly executed while the ignition switch is in an on-state.

Step S801: The battery diagnosis device 50 sets the operation mode of the battery diagnosis device 50 to the sleep mode. In the case where the operation mode just before the battery diagnosis control is started is the wake-up mode, the operation mode transitions from the wake-up mode to the sleep mode. In the case where the operation mode just before the battery diagnosis control is started is the sleep mode, the sleep mode is maintained as the operation mode. Thereby, some functions of the battery diagnosis device 50 stop, so that electric power consumption is reduced. After the operation mode is set to the sleep mode, the process proceeds to step S802.

Step S802: The battery diagnosis device 50 determines whether the current timing is a timing when the battery diagnosis device 50 diagnoses the second battery 30. This timing, for example, may be a timing when a certain time elapses from the last diagnosis, and typically, may be a timing when a certain time elapses after the operation mode is set to the sleep mode in step S801. In the case of the timing when the battery diagnosis device 50 diagnoses the second battery 30 (YES in step S802), the process proceeds to step S803.

Step S803: The battery diagnosis device 50 sets the operation mode of the battery diagnosis device 50 to the wake-up mode. That is, the operation mode of the battery diagnosis device 50 transitions from the sleep mode to the wake-up mode. Thereby, all functions of the battery diagnosis device 50 operate. After the operation mode is set to the wake-up mode, the process proceeds to step S804.

Step S804: The battery diagnosis device 50 executes the main diagnosis about all of the first item to the n-th item relevant to the second battery 30. The main diagnosis that is executed at this time is in accordance with FIG. 4. In FIG. 4, items that are targets of the diagnosis are all items of the first item to the n-th item. Further, a time after the battery diagnosis control starts and before the result of the determination by the main diagnosis is decided is set to a longer time than the first time.

Step S805: The battery diagnosis device 50 determines whether it is determined that there is abnormality about one or more items among the first item to the n-th item as a result of the main diagnosis. In the case where it is determined that there is abnormality about one or more items (YES in step S805), the process proceeds to step S807. On the other hand, in the case where it is determined that there is no abnormality about any item (NO in step S805), the process proceeds to step S806.

Step S806: The battery diagnosis device 50 determines that there is no abnormality in the second battery 30 (third determination). Further, the battery diagnosis device 50 clears and initializes all count values of the first counter to the n-th counter that are respectively provided for the first item to the n-th item relevant to the second battery 30. Thereafter, the process proceeds to step S808.

Step S808: The battery diagnosis device 50 sets the operation mode of the battery diagnosis device 50 to the sleep mode. That is, the operation mode of the battery diagnosis device 50 transitions from the wake-up mode to the sleep mode. Thereafter, the battery diagnosis device 50 ends the battery diagnosis control. As described above, the battery diagnosis device 50 periodically repeats the battery diagnosis control while the ignition switch is in the on-state.

Step S807: The battery diagnosis device 50 determines that there is abnormality in the second battery 30 (third determination), and ends the battery diagnosis control. In the case of this determination, as necessary, the battery diagnosis device 50 may execute a self-diagnosis of the electric power supply system 1 to record an abnormality log, may perform a measure such as separation of the second battery 30 from the electric power supply system 1, or may notify the occupant of the vehicle that there is abnormality in the second battery 30, through a display, a voice or the like. Further, in the case of this determination, if the abnormality in the second battery 30 is an abnormality that allows the battery diagnosis device 50 to be set to the sleep mode, the operation mode of the battery diagnosis device 50 may transition from the wake-up mode to the sleep mode.

Function Effect

As described above, in the case of diagnosing the state of the battery when the vehicle is at a standstill, the battery diagnosis device according to the embodiment of the present disclosure executes the "tentative diagnosis" of determining whether there is abnormality about the item relevant to the battery, at the time when the tentative decision time elapses from the start of the diagnosis. Then, in the case where it is determined in the tentative diagnosis that there is abnormality about the item, the battery diagnosis device executes the "main diagnosis" for a further time. By this control, in the case where abnormality has not occurred in the battery in the tentative diagnosis, it is possible to restore the battery diagnosis device to the sleep mode after only the tentative diagnosis of the battery diagnosis process when the vehicle is at a standstill. A time necessary for the tentative diagnosis is shorter than a time necessary for the main diagnosis, and therefore a time during which the battery diagnosis device operates for the battery diagnosis (a time during the wake-up mode) is shorter. Consequently, it is possible to reduce the electric power that is consumed for the battery diagnosis process and to restrain the decrease in the electricity storage rate of the battery when the vehicle is at a standstill.

In the case where there is a plurality of items relevant to the battery, the battery diagnosis device according to the embodiment executes the diagnosis about the plurality of items in parallel. Thereby, it is possible to efficiently execute the battery diagnosis.

In the case where it is determined in the tentative diagnosis that there is abnormality about the item (main-item) relevant to the battery, the battery diagnosis device according to the embodiment executes the main diagnosis about the sub-item in addition to the main-item. The sub-item is an item for which a state corresponding to the sub-item depends on a state corresponding to the main-item. Thereby, in the case where it is determined in the tentative diagnosis that the main-item is abnormal, the determination of whether the sub-item is normal or abnormal is suspended in the tentative diagnosis, and therefore it is possible to prevent an incorrect determination about the sub-item.

Furthermore, the battery diagnosis device according to the embodiment cumulatively records the result of the tentative diagnosis that is executed with a certain period, and determines that there is abnormality about an item for which the battery diagnosis device 50 determines in the tentative diagnosis that there is abnormality a certain number of times in a row, in the main diagnosis. Thereby, it is possible to perform not only the battery abnormality determination by the main diagnosis but also the battery abnormality determination by the tentative diagnosis, and therefore it is possible to improve the accuracy of the abnormality diagnosis.

The embodiment of the technology in the present disclosure has been described above. In addition to the battery diagnosis device, the present disclosure can be implemented as a battery diagnosis method that is executed by a battery diagnosis device including a processor and a memory, a control program for the method, a non-transitory computer-readable recording medium that stores the control program, or a vehicle on which an electric power supply system including the battery diagnosis device is mounted.

The present disclosure can be used as a battery diagnosis device that diagnoses the state of a battery mounted on a vehicle.

What is claimed is:

1. A system comprising:
   a battery mounted on a vehicle, the battery being configured to store electric power;
   at least one of a voltage sensor, a current sensor, and a temperature sensor configured to detect a corresponding at least one of a voltage, a current, and a temperature; and
   a battery diagnosis device configured to diagnose a state of the battery, the battery diagnosis device comprising a processor configured to:
      transition the battery diagnosis device to a wake-up mode in which a plurality of functions of the battery diagnosis device operate using the electric power of the battery;
      acquire information about the battery that includes the at least one of the voltage, the current, and the temperature; and
      execute diagnosis of the battery based on the acquired information about the battery, wherein
   in the diagnosis of the battery, the processor is configured to:
      i) determine, as a first determination, whether there is abnormality about a first item corresponding to a first state, based on a result of a determination of whether the state of the battery matches the first state, at a time point when a first time elapses from start of the diagnosis of the battery, when the vehicle is at a standstill, the determination of whether the state of the battery matches the first state being based on the information about the battery,
      ii) end the diagnosis of the battery and transition the battery diagnosis device from the wake-up mode to a sleep mode in which some functions of the plurality of functions stop and consumption of the electric power of the battery by the battery diagnosis device is reduced as compared to the wake-up mode, when the processor determines in the first determination that there is no abnormality about the first item, and iii) continue the diagnosis of the battery and determine, as a second determination, whether there is abnormality about the first item, after the time point when the first time elapses from the start of the diagnosis of the battery, when the processor determines in the first determination that there is abnormality about the first item.

2. The system according to claim 1, wherein
in the diagnosis of the battery, the processor is configured to:
i) determine, as the first determination, whether there is abnormality about the first item to an n-th item corresponding to the first state to an n-th state, based on a result of a determination of whether the state of the battery matches the first state to the n-th state, at the time point when the first time elapses from the start of the diagnosis of the battery, when the vehicle is at a standstill, the n being an integer of 2 or more, the determination of whether the state of the battery matches the first state to the n-th state being based on the information about the battery,
ii) end the diagnosis of the battery and transition the battery diagnosis device to the sleep mode, when the processor determines in the first determination that there is no abnormality about each of the first item to the n-th item, and
iii) continue the diagnosis of the battery and determine, as the second determination, whether there is abnormality about one or more items among the first item to the n-th item, after the time point when the first time elapses from the start of the diagnosis of the battery, when the processor determines in the first determination that there is abnormality about the one or more items.

3. The system according to claim 2, wherein the processor is configured to continue the diagnosis of the battery about all of the first item to the n-th item, as the second determination, and determine whether there is abnormality about all of the first item to the n-th item, after the time point when the first time elapses from the start of the diagnosis of the battery, when the processor determines in the first determination that there is abnormality about the one or more items.

4. The system according to claim 2, wherein the processor is configured to continue the diagnosis of the battery about the one or more items and sub-items, as the second determination, states that correspond to the sub-items depending on states that correspond to the one or more items, and determine whether there is abnormality about the one or more items and the sub-items, after the time point when the first time elapses from the start of the diagnosis of the battery, when the processor determines in the first determination that there is abnormality about the one or more items.

5. The system according to claim 1, wherein the processor is configured to determine, as the second determination, that there is abnormality about an item for which the processor determines in the first determination that there is abnormality when an abnormal state of the item for which the processor determines in the first determination that there is abnormality has consecutively continued for a second time from a time point after the start of the diagnosis of the battery and before the first time elapses.

6. The system according to claim 5, wherein the second time is set for each item.

7. The system according to claim 1, wherein the processor is configured to execute the first determination with a certain period, and to determine that there is abnormality about an item for which the processor determines in the first determination that there is abnormality a certain number of times in a row, as the second determination.

8. The system according to claim 1, wherein
in the diagnosis of the battery, the processor is configured to:
iv) determine, as a third determination, whether there is abnormality about the item, for a longer time than the first time, from the start of the diagnosis of the battery, with a certain period, when the vehicle is not at a standstill.

9. A method, comprising:
controlling a battery mounted on a vehicle to store electric power;
controlling at least one of a voltage sensor, a current sensor, and a temperature sensor to detect a corresponding at least one of a voltage, a current, and a temperature; and
executing by a processor of a battery diagnosis device configured to diagnose a state of the battery, a battery diagnosis method including:
transitioning the battery diagnosis device to a wake-up mode in which a plurality of functions of the battery diagnosis device operate using the electric power of the battery;
acquiring information about the battery that includes the at least one of the voltage, the current, and the temperature; and
executing diagnosis of the battery based on the acquired information about the battery, wherein
the diagnosis of the battery includes:
i) determining, as a first determination, whether there is abnormality about a first item corresponding to a first state, based on a result of a determination of whether the state of the battery matches the first state, at a time point when a first time elapses from start of the diagnosis of the battery, when the vehicle is at a standstill, the determination of whether the state of the battery matches the first state being based on the information about the battery,
ii) ending the diagnosis of the battery and transitioning the battery diagnosis device from the wake-up mode to a sleep mode in which some functions of the plurality of functions stop and consumption of the electric power of the battery by the battery diagnosis device is reduced as compared to the wake-up mode, when the processor determines in the first determination that there is no abnormality about the first item, and
iii) continuing the diagnosis of the battery and determining, as a second determination, whether there is abnormality about the first item, after the time point when the first time elapses from the start of the diagnosis of the battery, when the processor determines in the first determination that there is abnormality about the first item.

10. A system comprising:
a battery mounted on a vehicle, the battery being configured to store electric power;

at least one of a voltage sensor, a current sensor, and a temperature sensor configured to detect a corresponding at least one of a voltage, a current, and a temperature; and a non-transitory storage medium storing instructions that are executable by one or more processors of a battery diagnosis device and that cause the one or more processors to perform functions to diagnose a state of the battery, the functions comprising:

transitioning the battery diagnosis device to a wake-up mode in which a plurality of functions of the battery diagnosis device operate using the electric power of the battery;

acquiring information about the battery that includes the at least one of the voltage, the current, and the temperature; and executing diagnosis of the battery based on the acquired information about the battery, wherein the diagnosis of the battery includes:

i) determining, as a first determination, whether there is abnormality about a first item corresponding to a first state, based on a result of a determination of whether the state of the battery matches the first state, at a time point when a first time elapses from start of the diagnosis of the battery, when the vehicle is at a standstill, the determination of whether the state of the battery matches the first state being based on the information about the battery, ii) ending the diagnosis of the battery and transitioning the battery diagnosis device from the wake-up mode to a sleep mode in which some functions of the plurality of functions stop and consumption of the electric power of the battery by the battery diagnosis device is reduced as compared to the wake-up mode, when it is determined in the first determination that there is no abnormality about the first item, and iii) continuing the diagnosis of the battery and determining, as a second determination, whether there is abnormality about the first item, after the time point when the first time elapses from the start of the diagnosis of the battery, when it is determined in the first determination that there is abnormality about the first item.

11. The system according to claim 1, wherein the battery diagnosis device is mounted on the vehicle.

* * * * *